(12) United States Patent
Koshi et al.

(10) Patent No.: US 6,334,570 B1
(45) Date of Patent: Jan. 1, 2002

(54) SOLDERING METHOD

(75) Inventors: Masuo Koshi, Ikoma; Kenichirou Todoroki, Hirakata; Hiroaki Nakayama, Neyagawa; Tadahiko Sugimoto, Kadoma, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/628,274

(22) Filed: Jul. 28, 2000

(30) Foreign Application Priority Data

Jul. 29, 1999 (JP) .......................... 11-214445

(51) Int. Cl.$^7$ .......................... B23K 31/00; B23K 31/02
(52) U.S. Cl. .............. 228/180.22; 228/248.1
(58) Field of Search ............. 228/180.22, 248.1, 228/193, 195, 254, 262.1; 148/24; 420/558

(56) References Cited

U.S. PATENT DOCUMENTS

| | | | |
|---|---|---|---|
| 3,836,745 A | * 9/1974 | Costello | 219/85 |
| 4,468,076 A | * 8/1984 | Hine et al. | 339/75 M |
| 4,758,926 A | * 7/1988 | Herrell et al. | 361/385 |
| 4,921,157 A | * 5/1990 | Dishon et al. | 228/124 |
| 5,221,038 A | * 6/1993 | Melton et al. | 228/180.2 |
| 5,229,070 A | * 7/1993 | Melton et al. | 420/557 |
| 5,374,331 A | * 12/1994 | Costello | 156/640 |
| 5,463,191 A | * 10/1995 | Bell et al. | 174/263 |
| 5,551,627 A | * 9/1996 | Leicht et al. | 228/180.22 |
| 5,767,010 A | * 7/1998 | Mis et al. | 438/614 |
| 6,076,726 A | * 6/2000 | Hoffmeyer et al. | 228/180.22 |

* cited by examiner

*Primary Examiner*—M. Alexandra Elve
*Assistant Examiner*—Zidia Pittman
(74) *Attorney, Agent, or Firm*—Parkhurst & Wendel, L.L.P.

(57) ABSTRACT

A soldering method aimed to obtain higher bonding strength than conventionally obtained ones. With the soldering method according to the present invention, a Cu mounting surface is soldered with a preliminary solder comprising Sn-Cu, and a component is finally soldered to this preliminarily soldered surface with a solder comprising Sn-Ag-Cu-Bi. Thus, higher bonding strength can be obtained not only in the interface between the preliminary solder surface and the solder for final soldering, but also in the interface between the mounting surface and the preliminary solder.

3 Claims, 6 Drawing Sheets

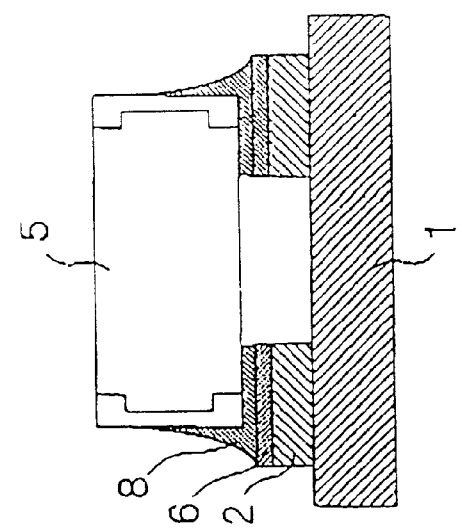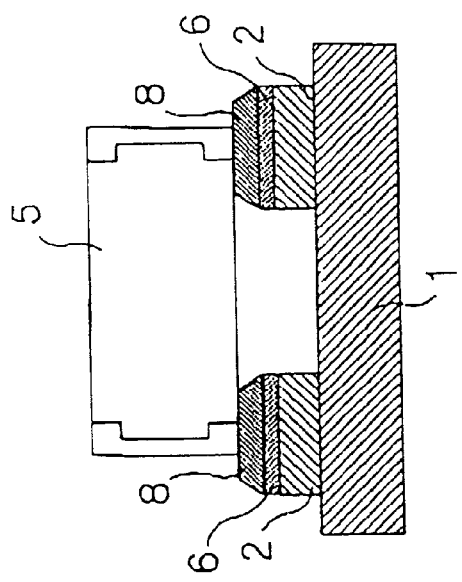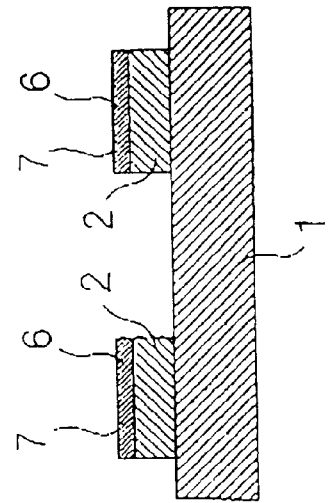

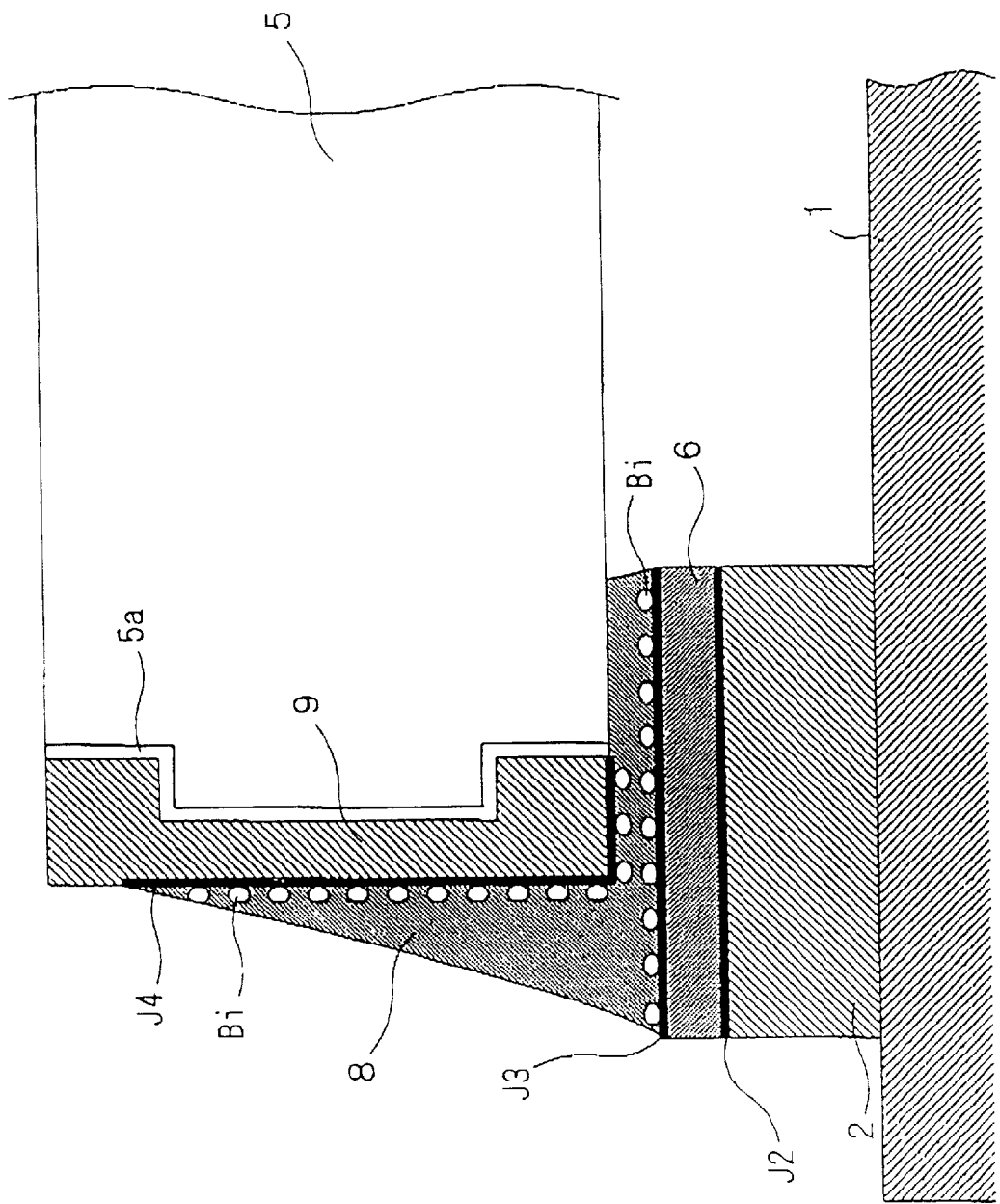

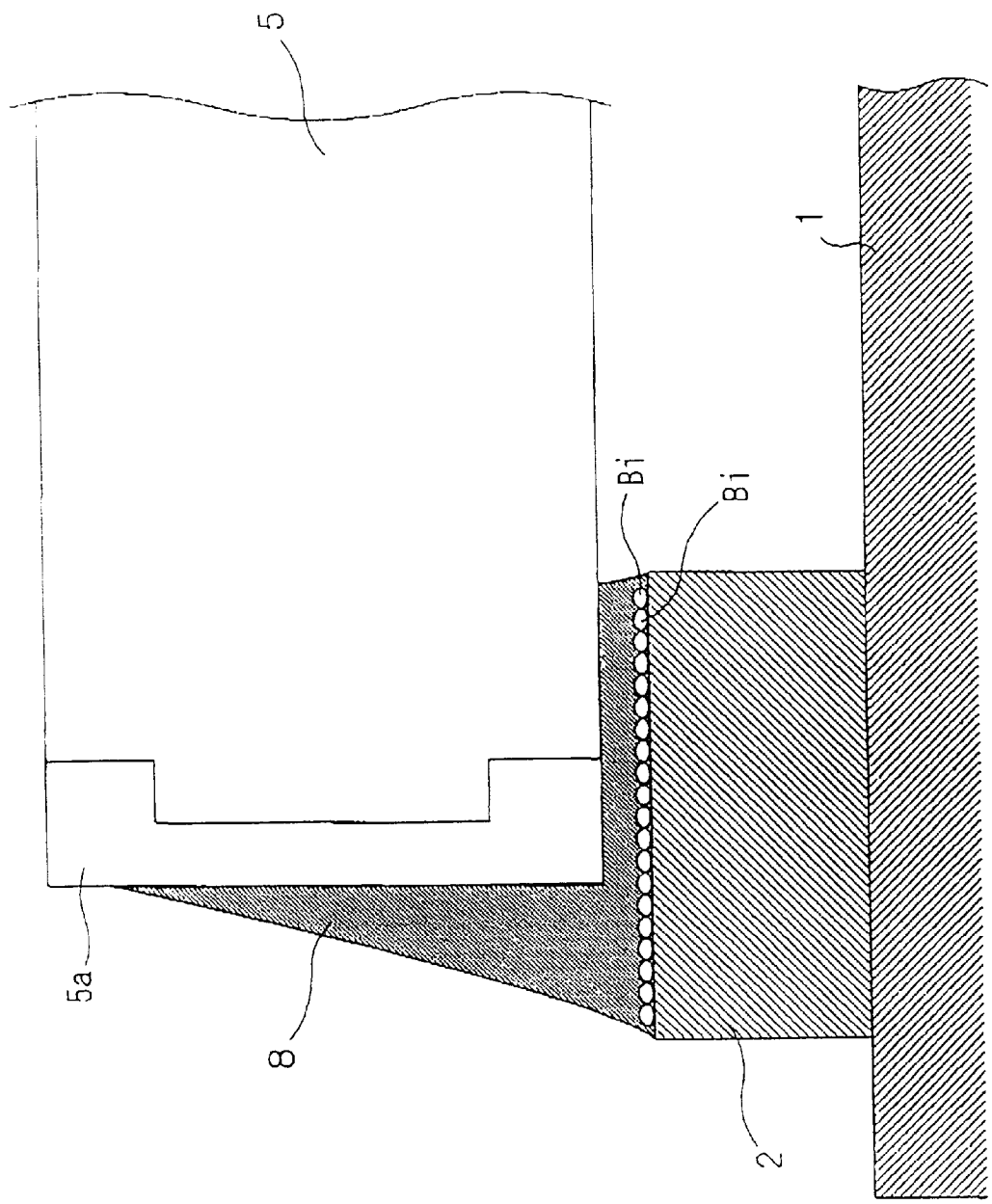

Prior Art

SOLDERING METHOD

FIELD OF THE INVENTION

The present invention relates to a method for soldering a component to a printed circuit board

BACKGROUND OF THE INVENTION

In mounting a component to a mounting surface of a printed circuit board by soldering, a preliminary solder is applied to the component to prevent non-wetting. With this preliminary soldered component put close to or abutted on the mounting surface of a mounting place, melted solder is supplied to the place for final soldering. In this case, the composition of the solder preliminary applied to the component is the same as that used for the final soldering.

JP-A7-254780 discloses a technology aimed to improve bonding strength. According to the technology, as shown in FIG. 6A, a preliminary solder 3 is applied to a mounting surface 2 made of Cu, of a printed circuit board 1 by using a high temperature solder (Sn-Pb) having a smaller tin content than an eutectic solder does. Then, as shown in FIG. 6B, the eutectic solder 4 is applied to the preliminarily soldered surface and reflow-processing is performed by blowing warm air to the eutectic solder 4. Then, as shown in FIG. 6C, the eutectic solder 4 is melted and solidified around an electrode 5a of a chip component 5 to finally solder the chip component 5.

When the solder 3 is preliminarily applied as shown in FIG. 6, wetting of the eutectic solder 4 to the solder 3 preliminarily applied is better than that of the eutectic solder 4 to the mounting surface 2 made of Cu. Also, the preliminary soldering makes a bonded interface stronger than that which has undergone no preliminary soldering. In FIG. 6C, the strong bonded interface is indicated by a symbol J1.

Though the configuration as shown in the FIG. 6 provides some improvements in the bonding strength, a higher bonding strength is required at present.

Particularly, in view of recycling of home electronic appliances, higher bonding strength is required of soldering using a lead-free solder which is attracted considerable attention as a solder material for use in home electronic appliances.

DISCLOSURE OF THE INVENTION

It is an object of the present invention to provide a soldering method aimed to obtain a higher bonding strength than conventionally obtained ones.

The soldering method of the present invention is characterized in that in soldering a component to a mounting surface which has been preliminarily soldered, a solder for preliminary soldering has a higher melting point than a solder for final soldering and comprises elements of the mounting surface and of at least part of the solder for final soldering, and the component is soldered to the preliminarily soldered mounting surface with the solder for final soldering.

Further, the soldering method of the present invention is characterized in that the mounting surface is made of Cu, the elements of the solder for final soldering are any one of (Sn-Ag-Cu-Bi), (Sn-Ag system plus additives), (Sn-Zn system plus additives), (Sn-Bi system plus additives) and (Sn-In system plus additives), and the element of the solder for preliminary soldering is Sn-Cu.

Further, the soldering method of the present invention is characterized in that in soldering a component which has been preliminarily soldered to a mounting surface, a solder for preliminary application had a higher melting point than a solder for final soldering of the component, and comprises elements of a to-be-soldered portion of the component and of at least a part of components of the solder for final soldering, and the preliminarily soldered component is soldered to the mounting surface with the solder for final soldering.

Further, the soldering method of the present invention is characterized in that the element of the to-be-soldered portion of the component is Cu, the elements of the solder for final soldering are any one selected from (Sn-Ag-Cu-Bi), (Sn-Ag system plus additives), (Sn-Zn system plus additives), (Sn-Bi system plus additives) and (Sn-In system plus additives), and the element of solder for preliminary soldering is Sn-Cu.

Still further, the soldering method of the present invention is characterized in that in soldering a component to a mounting surface, the mounting surface of Cu is preliminarily soldered with a solder comprising an Sn-Cu element, a to-be-soldered portion of Cu of the component is preliminarily soldered with the solder having the Sn-Cu element, and the preliminarily soldered component is soldered to the preliminary soldered mounting surface with a solder for final soldering, said solder for final soldering having elements of any one selected from (Sn-Ag-Cu-Bi), (Sn-Ag system plus additives), (Sn-Zn system plus additives), (Sn-Bi system plus additives) and (Sn-In system plus additives) for final soldering to the mounting surface preliminarily soldered.

As described above, according to the soldering method of the present invention, in soldering a component to a preliminarily soldered mounting surface, a solder used for such preliminary soldering has a higher melting point than a solder for final soldering of the component and comprises elements of a to-be-soldered portion of the component and of at least part of the solder for final soldering, and the preliminarily soldered component is soldered to the mounting surface with the solder for final soldering. Therefore, higher bonding strength is obtained not only in the bonding interface between the solder for preliminary soldering and the solder for final soldering, but also in the bonding interface between the mounting surface and the solder for preliminary soldering.

When the mounting surface is Cu, the solder for final soldering comprises any one selected from (Sn-Ag-Cu-Bi), (Sn-Ag system plus additives), (Sn-Zn system plus additives), (Sn-Bi system plus additives) and (Sn-In system plus additives), and the solder for preliminary soldering is Sn-Cu, higher bonding strength can be obtained also from such soldering as using a lead-free solder.

BRIEF DESCRIPTION OF THE DRAWINGS

FIG. 1 is a process chart of soldering according to a first embodiment of the present invention;

FIG. 4 is an enlarged schematic representation of the same embodiment;

FIG. 5 is an enlarged schematic representation showing an example comparative with the embodiments of the present invention.

DESCRIPTION OF THE EMBODIMENTS

The soldering method of the present invention is described below on the basis of specific embodiments.

(Embodiment 1)

Figure 2:
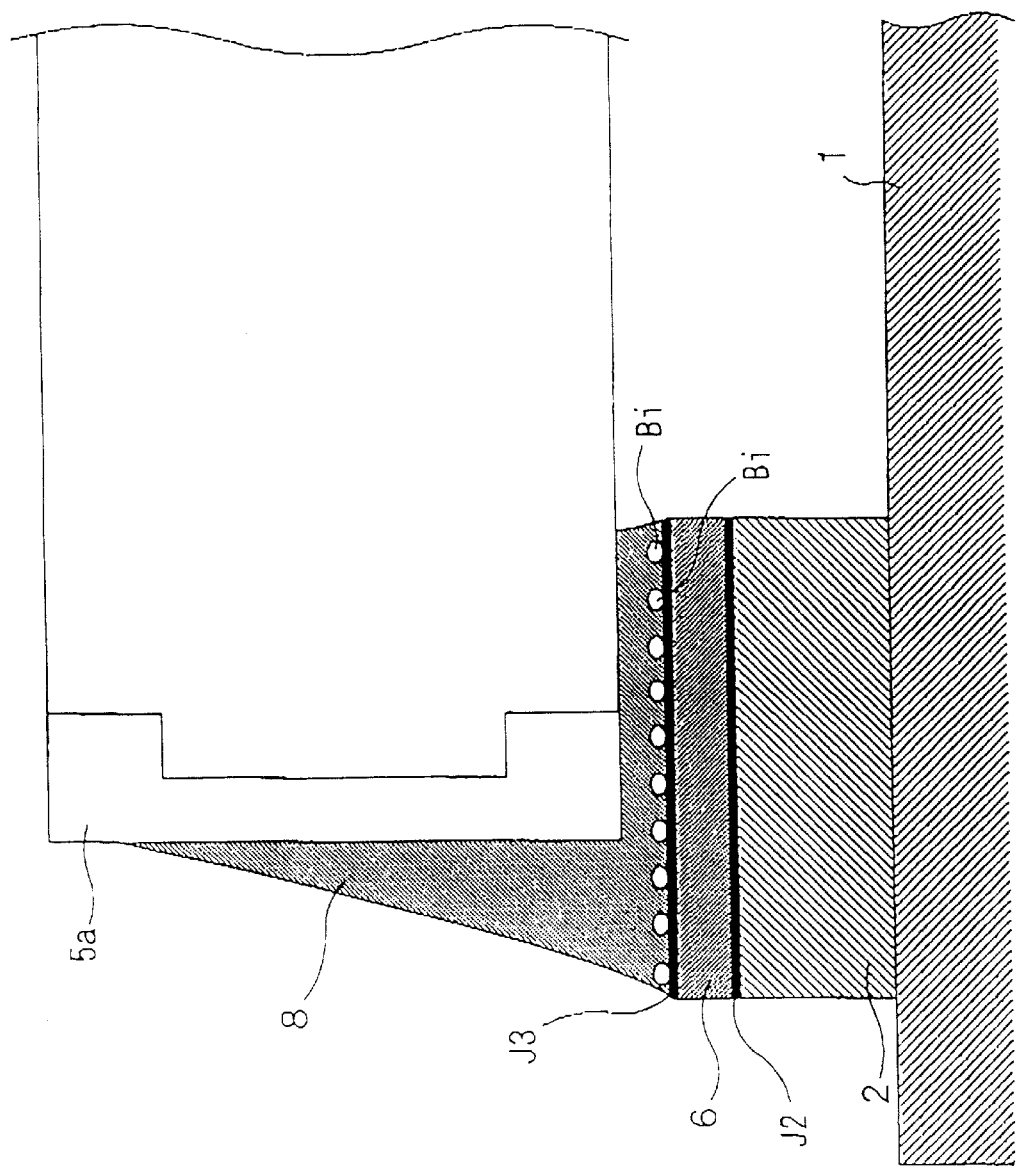
FIG. 2 is an enlarged schematic representation of the same embodiment.

FIG. 1 and FIG. 2 show an embodiment 1.

Figure 6A:
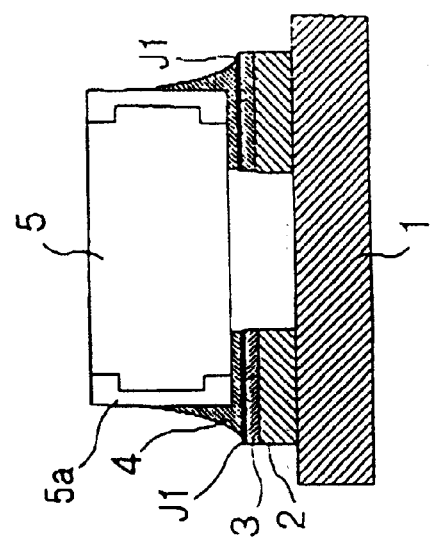
FIG. 6 is a process chart of a conventional soldering.
Figure 6B:
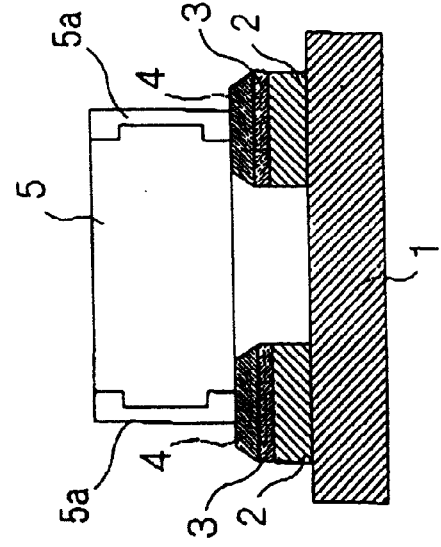
Figure 6C:
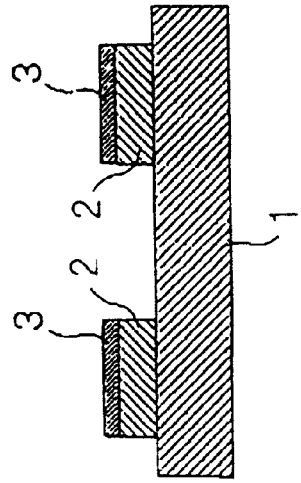

In mounting a chip component 5 on a printed circuit board 1 similar to a conventional example shown in FIG. 6, a solder 6 based on Sn-Cu for preliminary soldering is applied to a mounting surface 2 made of Cu, as shown in FIG. 1A. The solder 6 for preliminary soldering comprises 0.3 to 5.0 wt % of Cu with the rest being Sn, and has a thickness of 3 to 50 μm.

Turning to FIG. 1B, a melted solder 8 made of Sn-Ag-Cu-Bi for final soldering is applied to a preliminary soldering surface 7 of the solder 6 for preliminary soldering, and the chip component 5 to be mounted is placed on the solder 8 for final soldering. The solder for final soldering includes 0.5 to 5.0 wt % of Ag, 0.1 to 2.0 wt % of Cu and 0 to 5.0 wt % of Bi, with the rest being Sn.

The melting point of the solder 6 for preliminary soldering is 227° C. which is higher than the melting point of the solder 8 for final soldering of 217° C.

FIG. 1C shows a condition in which the solder 8 for final soldering is subjected to reflow processing in which warm air is blown, in the same condition as in the FIG. 1B, to cool and solidify the solder 8. FIG. 2 is an enlarged schematic representation of the FIG. 1C showing firmly bonded interfaces denoted by symbols J2 and J3.

In the bonding interface J2 between the mounting surface 2 of Cu and the Sn-Cu solder 6 for preliminary soldering, Cu which is a part of elements of the solder 6 for preliminary soldering is wetted to the mounting surface 2 of Cu to obtain higher bonding strength by forming a Cu-rich Sn-Cu.

The Sn-Cu solder 6 for preliminary soldering becomes rich in Cu on the side of the mounting surface 2. Contrary to this, the Sn-Cu solder 6 for preliminary soldering on the side of the solder 8 for final soldering becomes rich in Sn. Therefore, in the bonding interface J3 between the Sn-Cu solder 6 for preliminary soldering and the Sn-Ag-Cu-Bi solder 8 for final soldering, Sn which is a part of elements of the solder 8 for final soldering is wetted to the Sn-rich Sn-Cu solder 6 for preliminary soldering to provide higher bonding strength.

More specifically, Bi is added to the solder 8 for final soldering to lower the melting point. In solidification shown in the FIG. 1B and FIG. 1C, Sn which is a part of elements of the solder 8 for final soldering is rapidly wetted to the Sn-rich Sn-Cu solder 6 for preliminary soldering to cover the surface 7 of the preliminary solder, and the above described Bi does not concentrate to segregate in the bonding interface J3. Thus, the bonding interface J3 acquires higher bonding strength.

(Comparative Example)

FIG. 5 shows a comparative example.

The comparative example shows a case where the soldering with the Sn-Ag-Cu-Bi solder 8 for final soldering is carried out without application of the preliminary solder according to the embodiment 1. Each element of the solder 8 for final soldering has a melting point as follows: Sn=232° C., Ag=962° C., Cu=1084° C. and Bi=271° C.

When the chip component 5 is directly soldered to the mounting surface 2 of Cu by the reflow processing using the Sn-Ag-Cu-Bi solder 8 for final soldering, as the solder 8 for final soldering is solidified by being cooled from outside, Bi having a low melting point concentrates on the mounting surface 2 of Cu and solidifies in such concentrated state.

In the soldered condition like this, the concentration of Bi, of which particle is large and brittle, on the mounting surface 2 of Cu causes the bonding strength of the bonding interface to significantly lower.

(Embodiment 2)

FIG. 3 and FIG. 4 show embodiment 2.

Although an electrode 5a of the chip component 5 is not preliminarily soldered in the above described embodiment 1, in the embodiment 2, the electrode 5a of the chip component 5 is also preliminarily soldered. Here, a base material of the electrode 5a or a material applied onto the base material is Cu.

Figure 3B:
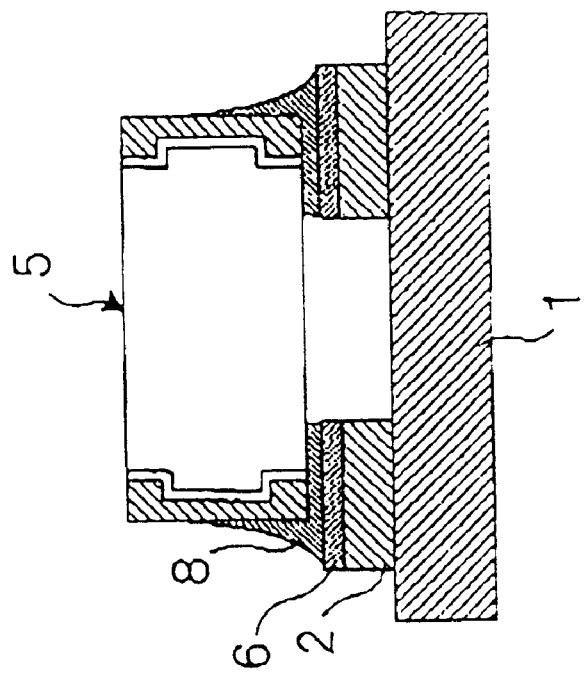
FIG. 3 is a process chart of soldering according to a second embodiment of the present invention.
Figure 3A:
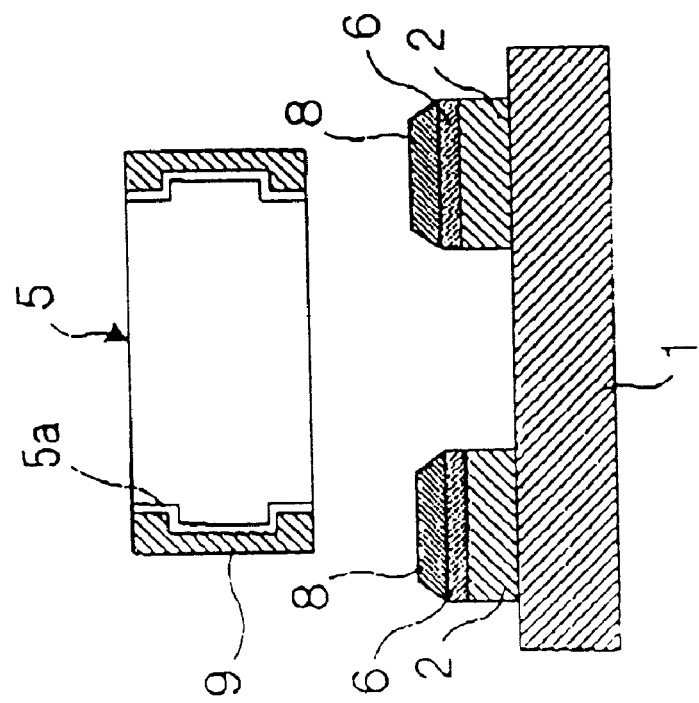

As shown in FIG. 3A, the Sn-Cu based preliminary solder 6 (including 0.3 to 5.0 wt % of Cu with the rest being Sn, film thickness being 3 to 50 μm) is applied on the mounting surface 2 for preliminary soldering, and the melting Sn-Ag-Cu-Bi solder 8 (including 0.5 to 5.0 wt % of Ag, 0.1 to 2.0 wt % of Cu and 0 to 5.0 wt % of Bi, with the rest being Sn) is applied on the preliminary soldering surface 7 of the solder 6. In addition, the Sn-Cu preliminary solder 9 (including 0.3 to 5.0 wt % of Cu with the rest being Sn) is applied onto the surface of the Cu electrode 5a of the chip component 5.

In the FIG. 3B, the chip component 5 is placed on the final soldering solder 8 to be subject to the reflow processing.

In this case, as shown in FIG. 4, firmly strong bonding interfaces J2 and J3 can be obtained between the mounting surface 2 and the preliminary solder 6 and between the preliminary solder 6 and the final soldering solder 8, as in the embodiment 1. Likewise, a firmly strong bonding interface J4 can also be obtained between the electrode 5a of the chip component and the final soldering solder 8.

(Embodiment 3)

Although the Sn-Ag-Cu-Bi final soldering solder 8 is used in each of the above described embodiments, the final soldering solder 8 may be composed of one of the followings as far as such has a lower melting point than that of the preliminary solder 6: (Sn-Ag system plus additives), (Sn-Zn system plus additives), (Sn-Bi system plus additives) and (Sn-In system plus additives).

In the case where the final soldering solder 8 is composed of (Sn-Ag system plus additives), Ag system is included for 2.0 to 5.0 wt %, the additives for 0 to 5.0 wt % and Sn for the rest.

In the case where the final soldering solder 8 is composed of (Sn-Zn system plus additives), Zn system is included for 2.0 to 10.0 wt %, the additives for 0 to 5.0 wt % and Sn for the rest.

In the case where the final soldering solder 8 is composed of (Sn-Bi system plus additives), Bi system is included for 35.0 to 60.0 wt %, the additives for 0 to 5.0 wt % and Sn for the rest.

In the case where the final soldering solder 8 is composed of (Sn-In system plus additives), In system is included for 40.0 to 60.0 wt %, the additives for 0 to 5.0 wt % and Sn for the rest.

The additives are prepared by formulating Bi, In, P, Ge, Ga and Ni singly or in combination. It includes Bi (0 to 5.0 wt %), In (0 to 5.0 wt %), P (0 to 1.0 wt %), Ge (0 to 1.0 wt %), Ga (0 to 1.0 wt %) and Ni (0 to 1.0 wt %). Bi is added to promote the lowering of the melting point. In is added to improve the strength of the solder and to promote the lowering of the melting point. P and Ge are added to prevent oxidization, Ga is to prevent crystals from increasing in size, and Ni is to improve fluidity.

(Embodiment 4)

In the above described embodiment 2 and embodiment 3, the preliminary solder is applied to both the mounting surface 2 of the printed circuit board 1 and the electrode 5a of the chip component. However, the preliminary solder 9 may be applied only to the electrode 5a of the chip component. In this embodiment, too, improved bonding strength can be expected as compared with the conventional soldering method.

In the above description of the present invention, soldering for the chip components has been described; however, the present invention may be well applied to soldering for every lead or electrode of semiconductors or electronic components.

What is claimed is:

1. A soldering method, wherein in soldering a component to a mounting surface, the mounting surface of Cu is preliminarily soldered with a solder having an Sn-Cu element, a to-be-soldered portion of Cu of the component is preliminarily soldered with the solder having the Sn-Cu element, and the preliminary soldered component is soldered to the preliminary soldered mounting surface with a solder for final soldering comprising any one selected from (Sn-Ag-Cu-Bi), (Sn-Ag system plus additives), (Sn-Zn system plus additives), (Sn-Bi system plus additives) and (Sn-In system plus additives).

2. A method of soldering a component to a mounting surface, comprising:

a) providing a mounting surface comprised of Cu and including a preliminary solder comprised of a Sn-Cu material; and b) soldering a component to the mounting surface by a final solder comprised of a material selected from the group consisting of Sn-Ag-Cu-Bi, Sn-Ag and additives, Sn-Zn and additives, Sn-Bi and additives, and Sn-In and additives; and c) wherein the melting point of the preliminary solder is higher than the melting point of the final solder.

3. A method of soldering a component to a mounting surface, comprising:

a) providing a component including a to-be-soldered portion comprised of Cu, and having been preliminarily soldered to a mounting surface by a preliminary solder comprised of a Sn-Cu material;

b) soldering the component to the mounting surface by a final solder comprised of a material selected from the group consisting of Sn-Ag-Cu-Bi, Sn-Ag and additives, Sn-Zn and additives, Sn-Bi and additives, and Sn-In and additives; and c) wherein the melting point of the preliminary solder is higher than the melting point of the final solder.

* * * * *